(12) United States Patent
Yip et al.

(10) Patent No.: US 9,899,488 B2
(45) Date of Patent: Feb. 20, 2018

(54) SEMICONDUCTOR DEVICE HAVING A TRENCH WITH DIFFERENT ELECTRODE MATERIALS

(71) Applicant: Infineon Technologies Austria AG, Villach (AT)

(72) Inventors: Li Juin Yip, Villach (AT); Martin Henning Vielemeyer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/414,674

(22) Filed: Jan. 25, 2017

(65) Prior Publication Data
US 2017/0133474 A1 May 11, 2017

Related U.S. Application Data

(62) Division of application No. 15/043,990, filed on Feb. 15, 2016, now Pat. No. 9,590,062.

(30) Foreign Application Priority Data

Feb. 16, 2015 (DE) .......................... 10 2015 202 764

(51) Int. Cl.
*H01L 23/48* (2006.01)
*H01L 29/40* (2006.01)
(Continued)

(52) U.S. Cl.
CPC ........ *H01L 29/4236* (2013.01); *H01L 29/401* (2013.01); *H01L 29/407* (2013.01);
(Continued)

(58) Field of Classification Search
CPC ............... H01L 29/4236; H01L 29/407; H01L 29/66734; H01L 29/7811; H01L 29/66719; H01L 29/66712; H01L 29/401
(Continued)

(56) References Cited

U.S. PATENT DOCUMENTS 5,640,034 A * 6/1997 Malhi ............... H01L 29/42368
257/330
5,929,481 A * 7/1999 Hshieh ................ H01L 29/0878
257/328
(Continued)

OTHER PUBLICATIONS

Saxena, Raghvendra Sahai et al., "Polysilicon Spacer Gate Technique to Reduce Gate Charge of a Trench Power MOSFET", IEEE Transactions on Electron Devices, vol. 59, No. 3, Mar. 2012, pp. 738-744.

*Primary Examiner* — Theresa T Doan
(74) *Attorney, Agent, or Firm* — Murphy, Bilak & Homiller, PLLC (57) ABSTRACT

A semiconductor device includes a semiconductor body having a front side and a back side, and a trench included in the semiconductor body. The trench extends into the semiconductor body along an extension direction that points from the front side to the back side. The trench includes an electrode structure and an insulation structure, the insulation structure insulating the electrode structure from the semiconductor body and the electrode structure being arranged for receiving an electric signal from external of the semiconductor device. The electrode structure includes a first electrode and a second electrode in contact with the first electrode, the first electrode including a first electrode material and the second electrode including a second electrode material different from the first electrode material. The first electrode extends further along the extension direction as compared to the second electrode.

6 Claims, 5 Drawing Sheets

(51) Int. Cl.
*H01L 29/423* (2006.01)
*H01L 29/78* (2006.01)
*H01L 29/66* (2006.01)

(52) U.S. Cl.
CPC .. *H01L 29/66719* (2013.01); *H01L 29/66734* (2013.01); *H01L 29/7813* (2013.01)

(58) Field of Classification Search
USPC .......................................... 257/330, 341–342
See application file for complete search history.

(56) References Cited

U.S. PATENT DOCUMENTS

| 7,371,641 | B2 | 5/2008 | Montgomery |
| 2011/0303925 | A1 | 12/2011 | Nishimura |
| 2012/0199899 | A1 | 8/2012 | Kobayashi et al. |

\* cited by examiner

SEMICONDUCTOR DEVICE HAVING A TRENCH WITH DIFFERENT ELECTRODE MATERIALS

TECHNICAL FIELD

This specification refers to embodiments of a method of producing a semiconductor device and to embodiments of a semiconductor device, for example to embodiments of a JFET, a MOSFET, an IGBT and the like. In particular, this specification refers to embodiments of a semiconductor device comprising a gate electrode inside a trench, the gate electrode being insulated from a semiconductor body by an insulating layer, as well as to embodiments of a method of manufacturing such products.

BACKGROUND

Many functions of modern devices in automotive, consumer and industrial applications, such as converting electrical energy and driving an electric motor or an electric machine, rely on semiconductor devices. For example, Junction Gate Field-Effect Transistors (JFETs), Metal Oxide Semiconductor Field-Effect Transistors (MOSFETs), and Insulated Gate Bipolar Transistors (IGBTs) are used for various applications including, but not limited to switches in power supplies and power converters.

Many of such semiconductor devices exhibit a vertical structure, e.g., they can be configured to switch currents and/or voltages between a source or an emitter terminal on a front side and a drain or collector terminal on a back side of a semiconductor body. Controlling of the switching can be achieved by means of a gate electrode that is arranged for receiving a control signal from external of the semiconductor device.

For example, the gate electrode of such vertical semiconductor devices is located at least partially inside a trench extending into the semiconductor body. The gate electrode can be insulated from the semiconductor body by an insulating layer such as an oxide layer.

SUMMARY

According to an embodiment, a method of producing a semiconductor device is presented. The method comprises: providing a semiconductor body having a front side; forming a mask on the front side; creating at least one opening in the mask, the opening exposing the front side; creating, underneath the at least one opening, at least one trench extending into the semiconductor body, the trench exhibiting at least one side wall and a trench bottom; creating, while the mask is arranged on the front side, an insulating layer that covers the trench bottom and the at least one side wall, wherein creating the insulating layer comprises growing a thermal oxide on the trench bottom and on the at least one side wall; depositing a spacer layer on the insulating layer, the spacer layer comprising a first electrode material; removing the spacer layer from at least a portion of the insulating layer that covers the trench bottom; filling at least a portion of the trench with an insulating material; removing only a part of the insulating material that is laterally confined by the spacer layer so as to leave an insulating block in the trench; and filling at least a portion of the trench with a second electrode material so as to form an electrode within the trench.

According to a further embodiment, another method of producing a semiconductor device is presented. The method comprises: providing a semiconductor body having a front side; forming a mask on the front side; creating at least one opening in the mask, the opening exposing the front side; creating, underneath the at least one opening, at least one trench extending into the semiconductor body, the trench exhibiting at least one side wall and a trench bottom; laterally recessing the mask from a rim of the trench by a distance; depositing an insulating layer that covers the mask, a part of the front side of the semiconductor body where the mask has been laterally recessed, the trench bottom, and the at least one side wall; depositing a spacer layer on the insulating layer, the spacer layer comprising a first electrode material; removing the spacer layer from at least a portion of the insulating layer that covers the trench bottom; filling at least a portion of the trench with an insulating material; removing only a part of the insulating material that is laterally confined by the spacer layer so as to leave an insulating block in the trench; and filling at least a portion of the trench with a second electrode material so as to form an electrode within the trench.

According to yet a further embodiment, a semiconductor device is presented. The semiconductor device comprises a semiconductor body, the semiconductor body having a front side and a back side, a trench included in the semiconductor body, the trench extending into the semiconductor body along an extension direction that points from the front side to the back side. The trench comprises an electrode structure, and an insulation structure, the insulation structure insulating the electrode structure from the semiconductor body and the electrode structure being arranged for receiving an electric signal from external of the semiconductor device. The electrode structure includes a first electrode and a second electrode in contact with the first electrode, the first electrode comprising a first electrode material and the second electrode comprising a second electrode material different from the first electrode material. The first electrode extends further along the extension direction as compared to the second electrode.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

In the following, reference is made to the accompanying drawings which form a part hereof and in which are shown by way of illustration specific embodiments in which the invention may be practiced.

In this regard, directional terminology, such as "top", "bottom", "below", "beneath", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor contact region or of a front side of a semiconductor body.

The term "vertical" as used in this specification intends to describe an orientation which is substantially arranged perpendicular to the horizontal surface, i.e. parallel to the normal direction of the surface of the semiconductor substrate or the semiconductor contact region or the front side of the of a semiconductor body.

In the context of the present specification, the term "in contact" intends to describe that there is a direct physical connection between two elements of the respective semiconductor device; e.g., a transition between two elements being in contact with each other should not include a further intermediate element or the like.

Specific embodiments described in this specification pertain to, without being limited thereto, embodiments of a power semiconductor device, such as a semiconductor device exhibiting a JFET structure, a MOSFET structure or an IGBT structure.

The term "power semiconductor device" as used in this specification intends to describe a semiconductor device on a single chip with high voltage blocking and switching and/or high current carrying and switching capabilities. In other words, power semiconductor devices are intended for high current, e.g., in the Ampere range, e.g., up to several Ampere, and/or high voltages, e.g., above 200 V, above 600 V and above.

However, it shall be understood that the present disclosure is not limited to power semiconductor devices. In addition or in alternative to power semiconductor devices, the principles, devices and methods disclosed herein may also be applied to low voltage semiconductor devices, for example to semiconductor devices suitable for a voltage of no more than 10 V, no more than 25 V, no more than 100 V, or no more than 200 V.

Figure 1:
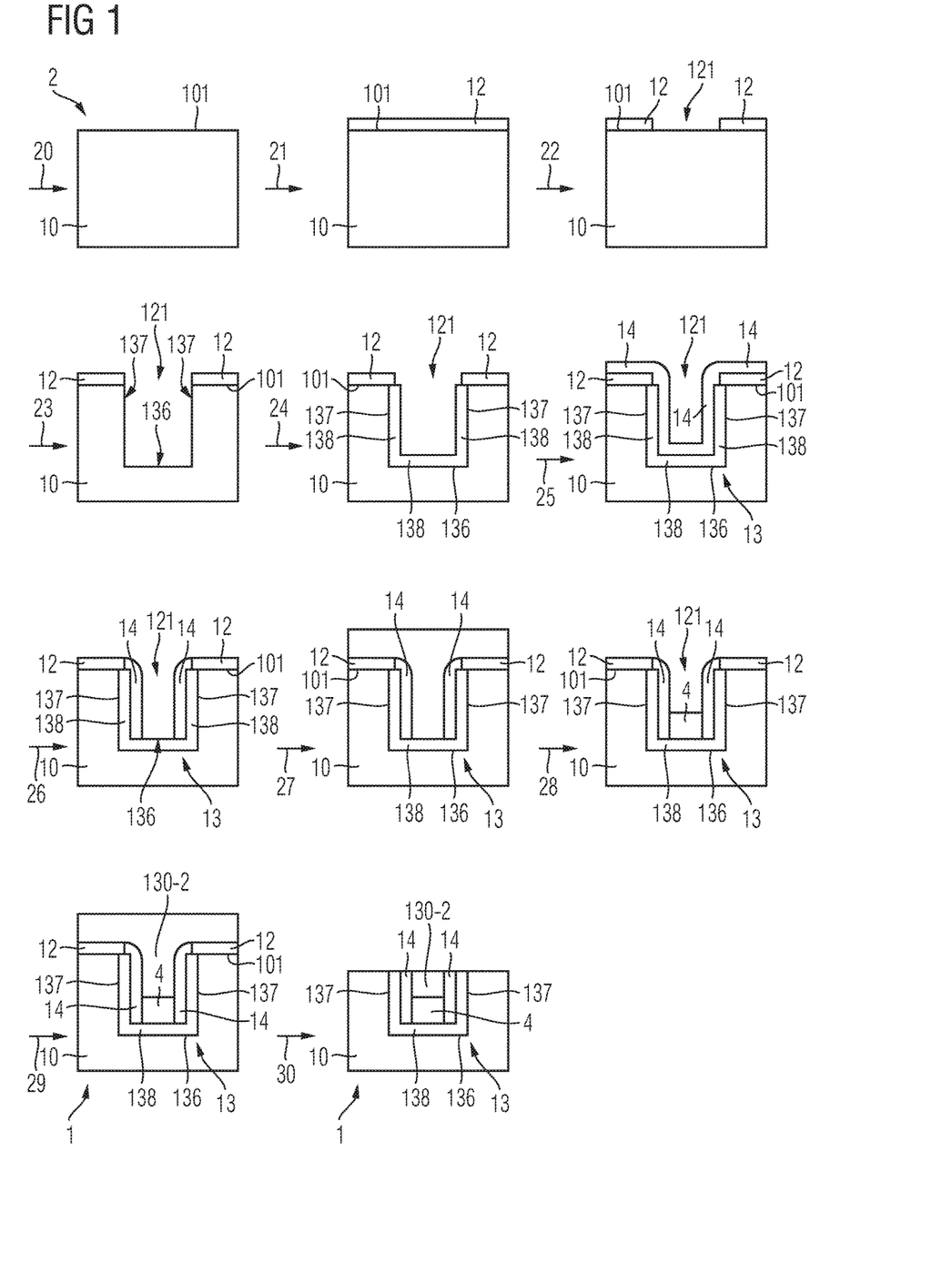
FIG. 1 schematically illustrates steps of a method of producing a semiconductor device according to one or more embodiments.

FIG. 1 schematically illustrates steps of a method 2 of producing a semiconductor device 1 according to one or more embodiments. The method 2 may comprise several steps, at least some of which are illustrated in FIG. 1 by means of drawings of a section of a vertical cross-section schematically and exemplary depicting the semiconductor device 1 in a respective specific state of production:

In a first step 20, a semiconductor body 10 having a front side 101 is provided. In an embodiment, the semiconductor body 10 comprises a semiconductor body material, such as silicon (Si) or silicon carbide (SiC). For example, the semiconductor body 10 can be a portion of a silicon (Si) wafer or of a silicon carbide (SiC) wafer.

In a next step 21, a mask 12 is formed on the front side 101. For instance, forming the mask 12 can comprise depositing at least one of silicon dioxide ($SiO_2$) and silicon nitride ($Si_3N_4$) on the front side 101 of the semiconductor body 10. In an embodiment, the mask 12 is a hard mask.

In a subsequent step 22, the mask 12 may be structured by creating an opening 121 in the mask 12, e.g., using a lithographical method. The opening 121 may expose a portion of the front side 101 of the semiconductor body 10.

Within a step 23, a trench 13 that extends into the semiconductor body 10 is created underneath the opening 121. For example, creating the trench 13 can be achieved by an anisotropic etch process, wherein the front side 101 of the semiconductor body 10 is protected by the mask 12 except for a portion underneath the opening 121 of the mask 12. The created trench 13 has at least one side wall 137 and a trench bottom 136.

In accordance with the embodiment illustrated in FIG. 1, the trench 13 exhibits two substantially vertically aligned side walls 137 and the trench bottom 136 is substantially horizontally aligned, e.g., arranged substantially perpendicular to the side walls 137.

For example, the trench 13 exhibits a width of less than 300 nm, such as less than 200 nm; i.e., the distance between the two side walls 137 may amount to less than 300 nm, or to less than 200 nm.

In a next step 24, an insulating layer 138 that covers the trench bottom 136 and the side walls 137 is created while the mask 12 is arranged on the front side 101, wherein the creating may comprise growing a thermal oxide on the trench bottom 136 and on the side walls 137. For example, it can thereby be substantially avoided that the insulating layer 138 is also created on the front side 101.

The method 2 may further comprise, in a subsequent step 25, depositing a spacer layer 14 on the insulating layer 138, wherein the spacer layer 14 comprises a first electrode material. For example, at least one of polysilicon, metal and a metal silicide may be used as the first electrode material.

For example, the spacer layer 14 also covers parts of the mask 12.

Subsequently, in a step 26, the spacer layer 14 is removed from at least a portion of the insulating layer 138 that covers the trench bottom 136. For instance, removing the spacer layer 14 from the portion of the insulating layer 138 that covers the trench bottom 136 can include an anisotropic etch process, such as a plasma supported etch process. For example, a reactive ion beam etch process may be used.

For example, the removing of the spacer layer 14 from at least the portion of the insulating layer 138 that covers the trench bottom 136 (cf. step 26) is carried out while simultaneously leaving portions of the spacer layer 14 extending along portions of the insulating layer 138 that covers the side walls 137.

Further, the method 2 may comprise a step 27, in which at least a portion of the trench 13 is filled with an insulating material. For example, filling the portion of the trench 13 with the insulating material can include depositing silicon dioxide ($SiO_2$). In an embodiment, a deposition of tetraethyl orthosilicate (TEOS) may be applied for carrying out the filling. Further examples for the insulating material are a high-density plasma (HDP) oxide, silicon nitride, or silicon oxynitride.

In a further step 28, only a part of the insulating material that is laterally confined by the spacer layers 14 can be removed so as to leave an insulating block 4 in the trench 13. For example, during such removing of the insulating material inside the trench 13, the insulating layer 138 may be protected by the spacer layer 14, as illustrated in FIG. 1. Thus, removing the insulating material 4 can, for example, comprise an anisotropic etch process, such as reactive ion beam etching, or a wet etch process without damaging the insulating layer 138.

At least a portion of the trench 13 is then, in a subsequent step 29, filled with a second electrode material so as to form an electrode 130-2 within the trench 13. For example, the electrode 130-2 is arranged above the insulating block 4. The spacer layer 14 may extend further along the trench 13 as compared to the electrode 130-2. Further, the electrode 130-2 may be in contact with the spacer layers 14 adjacent to the insulating layer 138 that covers the side walls 137.

The first and second electrode materials can have different electric conductivities. For example, the electric conductivity of the second electrode material of the electrode 130-2 can be higher than the electric conductivity of the first electrode material of the spacer layers 14.

In an embodiment, the mean electric conductivity of the spacer layers 14 is lower than the mean electric conductivity of the electrode 130-2.

In accordance with a further embodiment, the first electrode material may be identical to the second electrode material. Thus, the mean electric conductivity of the spacer layers 14 may be identical to the mean electric conductivity of the electrode 130-2.

Further, the electrode 130-2 and the spacer layers 14 may form an electrode structure, wherein the electrode structure may be configured for receiving an electric signal, such as a control signal, from external of the semiconductor device 1. Further optional characteristics of the electrode structure will be explained in more detail with respect to FIG. 3 to FIG. 5B.

For example, the electrode 130-2 may serve as a good conductor for transporting the electric signal, e.g., in the form of a voltage and/or a charging current received from external of the semiconductor device 1, along a central part of the trench 13. In an embodiment, the electrode 130-2 is a metallic electrode. The spacer layers 14 that comprise the first electrode material can be configured for receiving the electric signal and for inducing a channel in the semiconductor body 10 along the side walls 137 of the trench 13. For example, the first electrode material is a material that is appropriate for this purpose, e.g., in terms of a work function at the insulating layer 138, which may be a gate oxide. For example, polysilicon is used as the first electrode material of the spacer layers 14.

After the filling of at least the portion of the trench 13 with a second electrode material, the method 2 can further comprise a step 30, in which portions of the second electrode material, of the mask 12, of the spacer layers 14, of the insulating layer 138 and of the semiconductor body 10 are removed, e.g., down to a certain depth along a vertical extension direction of the trench 13. This step can comprise at least one of an etch process, a polishing process, a chemical-mechanical planarization (CMP) process.

Figure 2:
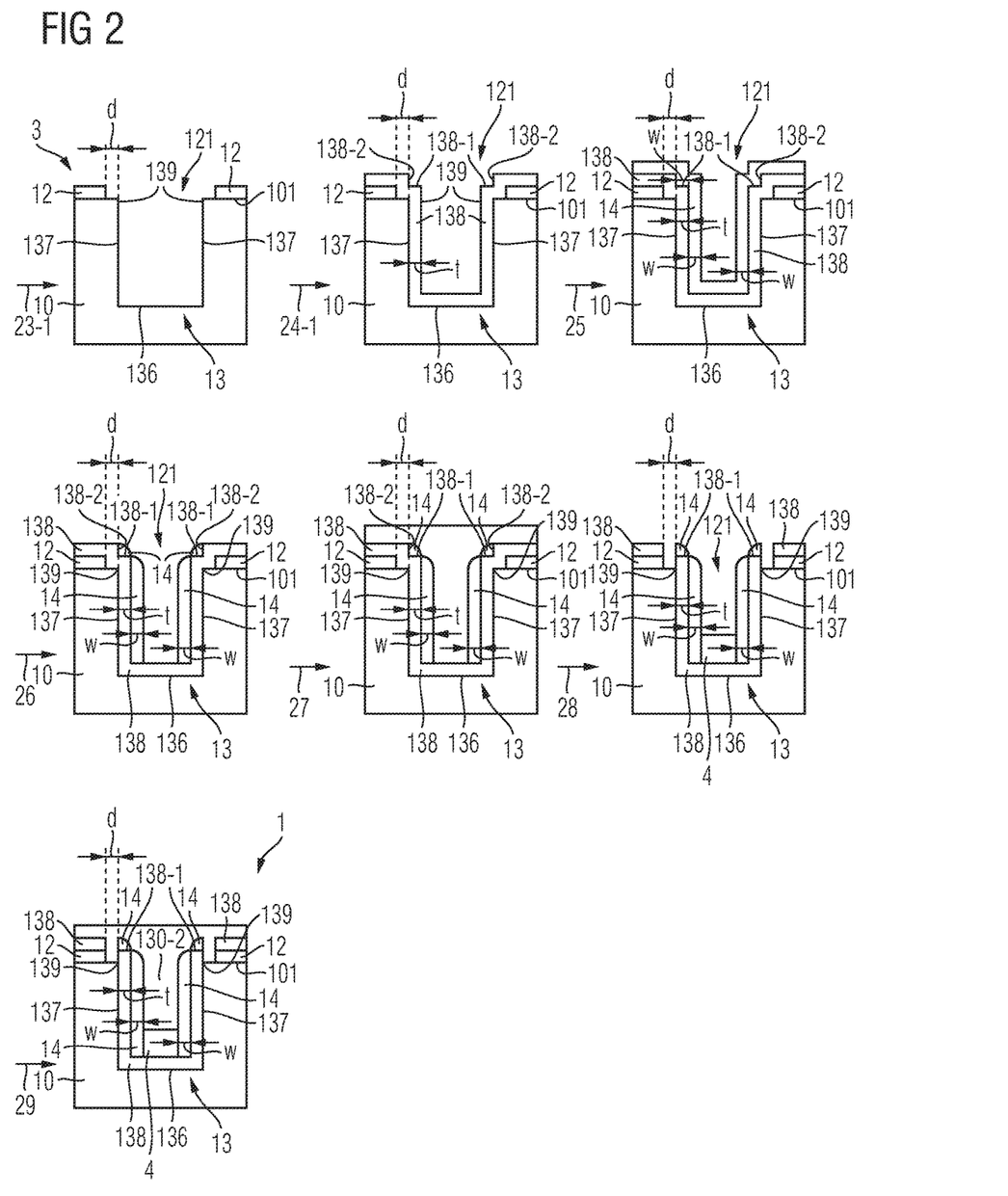
FIG. 2 schematically illustrates steps of a method of producing a semiconductor device according to one or more embodiments.

FIG. 2 schematically illustrates steps of another method 3 of producing a semiconductor device 1 according to one or more embodiments.

The method 3 may comprise several steps, at least some of which are illustrated in FIG. 2 by means of drawings of a section of a vertical cross-section schematically and exemplary depicting the semiconductor device 1 in a respective specific state of production.

The method 3 may also comprise steps 20 to 23 as schematically and exemplarily illustrated in FIG. 1 and as described above. However, steps 20 to 23 are not depicted in FIG. 2.

Subsequent to creating, within the step 23, the trench 13, the method 3 may comprise a step 23-1 of laterally recessing the mask 12 from a rim 139 of the trench 13 by a distance d. For example, the rim 139 is formed by upper ends of the side walls 137 of the trench 13, the upper ends constituting a trench opening.

In an embodiment, the step 23-1 of laterally recessing the mask 12 from a rim 139 of the trench 13 may include carrying out a wet chemical etch process.

The distance d may be a distance in a horizontal direction, e.g., in a direction substantially in parallel with a surface of the front side 101 and/or in a direction substantially in parallel with a normal of a surface of the side walls 137.

Further, the laterally recessing may expose a part of the front side 101 of the semiconductor body 10 where the mask 12 has previously been formed on.

A next step 24-1 may include depositing an insulating layer 138 that covers the mask 12, the part of the front side 101 of the semiconductor body 10 where the mask 12 has been laterally recessed, the trench bottom 136 and the side walls 137. For example, a thickness t of the deposited insulating layer 138 can be smaller than or equal to the distance d, wherein the thickness t and the distance d may be determined along the same direction, e.g., in a direction substantially in parallel with a normal of a surface of the side walls 137.

In an embodiment, the depositing 24-1 of an insulating layer 138 is carried out so as to create a horizontal surface 138-1 of the insulating layer 138, wherein the horizontal surface 138-1 may substantially be in parallel with a normal of a surface of the side walls 137, wherein the horizontal surface 138-1 may further cover portions of the insulating layer 138 extending along the side walls 137 of the trench 13 from above, e.g., in a vertical direction substantially in parallel with a surface of the side walls 137.

For example, the horizontal surface 138-1 may completely cover the portions of the insulating layer 138 that cover the side walls 137 of the trench 13 from above. For example, upon depositing, within step 24-1, the insulating layer 138, a step-like structure may be created in the region where the mask 12 has been laterally recessed 23-1 that comprises the horizontal surface 138-1 and a vertical surface 138-2 of the insulating layer 138, wherein the step-like structure may substantially follow the contour of the mask 12 and of the part of the front side 101 of the semiconductor body 10 where the mask 12 has been laterally recessed 23-1.

In accordance with an embodiment, depositing 24-1 the insulating layer 138 comprises depositing an oxide, such as silicon dioxide. Further, the mask 12 may comprise the same material as the insulating layer 138.

Similar to the embodiment of the method 2 illustrated in FIG. 1, a spacer layer 14 is deposited, within a step 25, on the insulating layer 138, wherein the spacer layer 14 comprises a first electrode material. Further, as has been explained above, a thickness w of the deposited spacer layer 14 can be equal to or larger than a thickness t of the deposited insulating layer 138, wherein the thickness w of the deposited spacer layer 14 and the thickness t of the deposited insulating layer 138 may be determined along the same direction, e.g., in a direction substantially in parallel with a normal of a surface of the side walls 137.

For example, the method 3 may include further steps 26 to 29, which may be carried out in a manner similar or equal to the steps 26 to 29 that have been described above with respect to FIG. 1.

Accordingly, in a step 26, the spacer layer 14 is removed from at least a portion of the insulating layer 138 that covers the trench bottom 136.

For example, the removing 26 of the spacer layer 14 from at least a portion of the insulating layer 138 that covers the trench bottom 136 may be carried out so as to leave portions of the spacer layer 14 extending along portions of the insulating layer 138 that covers the side walls 137.

Further, the removing 26 of the spacer layer 14 may be carried out so as to leave portions of the spacer layer 14 that cover the horizontal surface 138-1 of the insulating layer from above.

For instance, removing the spacer layer 14 from the portion of the insulating layer 138 that covers the trench bottom 136 can include an anisotropic etch process, such as a plasma supported etch process. For example, a reactive ion beam etch process may be used.

In step 27, in a way similar or equal to step 27 of the method 2 described above with respect to FIG. 1, at least a portion of the trench 13 is filled with an insulating material.

Further, within step 28, only a part of the insulating material that is laterally confined by the spacer layers 14 can be removed so as to leave an insulating block 4 in the trench 13. Removing the insulating material 4 can, for example, comprise an anisotropic etch process, such as reactive ion beam etching, or a wet etch process without damaging the insulating layer 138.

For example, during such removing of the insulating material inside the trench 13, the insulating layer 138 may be protected by the spacer layer 14, as illustrated in FIG. 1.

For instance, portions of the insulating layer 138 that cover the side walls 137 of the trench 13 may be protected by the portions of the spacer layer 14 that cover the horizontal surface 138-1.

In another embodiment, portions of the insulating layer 138 that are not covered from above, for example by either of portions of the spacer layer 14 and the mask 12, may be removed during the step 28. For instance, as depicted in FIG. 2, a portion of the insulating layer 138 covering the parts of the front side 101 of the semiconductor body 10 where the mask 12 has been laterally recessed in step 23-1 may be removed so as to expose the parts of the front side 101 of the semiconductor body 10.

The step 28 of removing the insulating material may comprise an anisotropic etch process. As in the method 2 illustrated in FIG. 2, during the removing of parts of the insulating material inside the trench 13, the insulating layer 138 may be protected by the spacer layer 14.

Further, as in the method 2 described above, in step 29, at least a portion of the trench 13 is filled with a second electrode material so as to form an electrode 130-2 within the trench 13.

Optionally, method 3 may further include a step 30 (not depicted) of removing portions of the second electrode material, of the mask 12, of the spacer layers 14, of the insulating layer 138 and of the semiconductor body 10, e.g., down to a certain depth along the vertical extension direction of the trench 13. This step can comprise at least one of an etch process, a polishing process, and a chemical-mechanical planarization (CMP) process. For example, during carrying out of step 29, a contact between the electrode 130-2 and the front side 101 of the semiconductor body 10 may be created in the region of the front side 101 where the mask 12 has been laterally recessed during step 23-1. By carrying out step 30, the contact may be removed. In other words, as schematically illustrated by FIG. 1, the certain depth may be chosen such that portions of the semiconductor device 1 are removed so to reduce the distance between the trench bottom 136 and the front side 101. For example, after carrying out step 30, the front side 101 is not covered by any material anymore.

Figure 3:
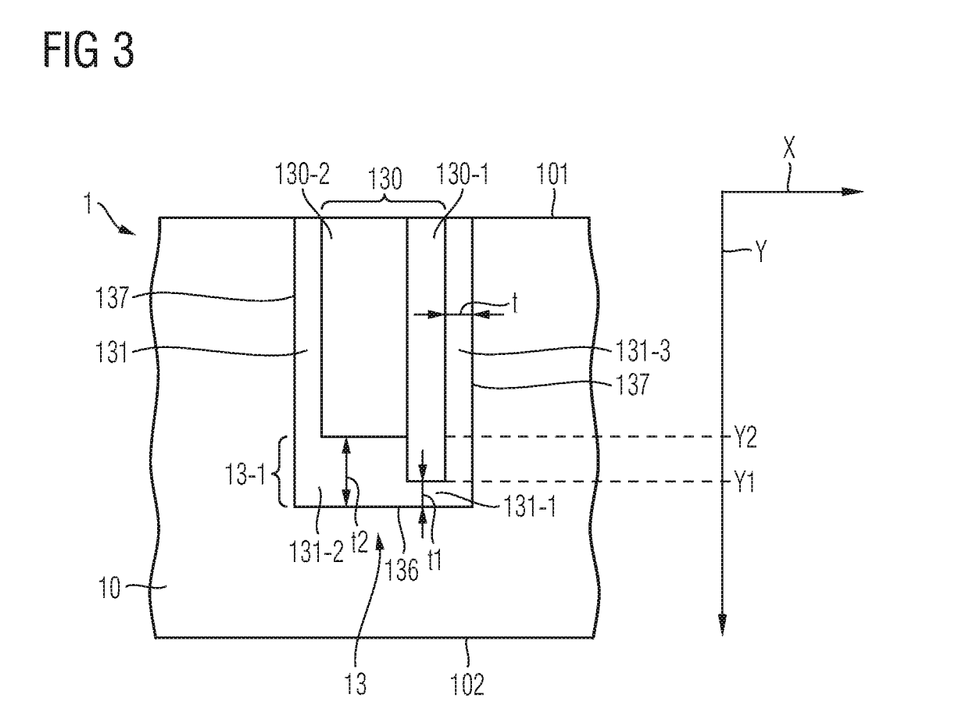
FIG. 3 schematically illustrates a section of a vertical cross-section of a semiconductor device according to one or more embodiments.

FIG. 3 schematically illustrates a section of a vertical cross-section of a semiconductor device 1 according to one or more embodiments. For example, the semiconductor device 1 is produced by carrying out at least one of the methods 2 and 3 described with respect to FIG. 1 and FIG. 2.

The semiconductor device 1 comprises a semiconductor body 10, wherein the semiconductor body 10 has a front side 101 and a back side 102. For example, the semiconductor body 10 can comprise one of silicon (Si) or silicon carbide (SiC).

Further, the semiconductor device 1 comprises a trench 13 included in the semiconductor body 10, the trench 13 extending into the semiconductor body 10 along an extension direction Y that points from the front side 101 to the back side 102.

For example, the trench 13 exhibits a width, in a direction substantially perpendicular to the extension direction Y, of less than 300 nm, such as less than 200 nm; i.e., the distance between two side walls 137 of the trench 13 may amount to less than 300 nm, or to less than 200 nm.

In an embodiment, the trench 13 has been produced by carrying out at least one of step 23 and step 24 as explained above.

The trench 13 comprises an electrode structure 130 and an insulation structure 131 that insulates the electrode structure 130 from the semiconductor body 10. The electrode structure 130 can be arranged for receiving an electric signal from external of the semiconductor device 1.

The insulation structure 131 can comprise an oxide, for instance silicon dioxide. In an embodiment, the insulation structure 131 has been produced by carrying out at least one of the steps 24 or 24-1 explained above. Thus, the insulation structure 131 may comprise the insulating layer 138.

The electrode structure 130 may form a gate electrode of a JFET, a MOSFET or an IGBT. For example, the electrode structure 130 can be electrically connected to a gate terminal (not shown) of the semiconductor device 1. In another embodiment, the electrode structure 130 may form a compensation field plate electrode structure of a JFET or a MOSFET, wherein the electrode structure 130 may be electrically connected to a source terminal (not shown) of the semiconductor device 1.

The electrode structure 130 includes a first electrode 130-1 and a second electrode 130-2 in contact with the first electrode 130-1, the first electrode 130-1 comprising a first electrode material and the second electrode 130-2 comprising a second electrode material different from the first electrode material.

In an embodiment, the first electrode 130-1 has been produced by carrying out at least step 25 explained above. Thus, the first electrode 130-1 may comprise the spacer layer 14. Further, the second electrode 130-2 may have been produced by carrying out at least step 29 explained above.

For example, the first electrode 130-1 extends further along the extension direction Y as compared to the second electrode 130-2, for example by a distance of at least 40 nm, or at least 50 nm, or at least 80 nm, or at least 100 nm. In accordance with an embodiment, the value of the distance can be chosen in dependence of the voltage range for which the semiconductor device 1 shall be used. For example, if the semiconductor device 1 shall be used in a high voltage range, a longer distance, e.g., of at least 90 nm can be chosen, whereas if the semiconductor device 1 shall be used in a low voltage range, a shorter distance, e.g., of at least 40 nm, can be chosen.

The first electrode material exhibits a first electric conductivity and the second electrode material exhibits a second electric conductivity, wherein the second electric conductivity can be higher than the first electric conductivity. For example, the mean electric conductivity of the second electrode 130-2 is higher than the mean electric conductivity of the first electrode 130-1, e.g., by a factor of at least 1.5, or by at least 2, or by at least 10, or even higher, e.g., by a factor of at least 100, or even by a factor of at least 1000.

In accordance with an embodiment, the first electrode material can comprise polysilicon, whereas the second electrode material can comprise one of polysilicon or metal. For example, the second electrode 130-2 may serve as a good conductor for transporting the electric signal, e.g., a control signal, such as a gate signal, in the form of a voltage and/or a charging current received from external of the semiconductor device 1 along a central part of the trench 13. In an embodiment, the second electrode 130-2 is a metallic electrode.

The first electrode 130-1 may be arranged and configured for receiving the electric signal and for inducing a channel in the semiconductor body 10 along the side walls 137 of the trench 13. For example, the first electrode material is a material that is appropriate for this purpose, e.g., in terms of a work function at the insulating structure 131, which may be a gate oxide. For example, polysilicon is used as the first electrode material of the first electrode material.

For example, a part of the insulation structure 131 is arranged in a bottom region 13-1 of the trench 13. The part of the insulation structure 131 may have a first insulation zone 131-1 and a second insulation zone 131-2, wherein the first insulation zone 131-1 is arranged below the first electrode 130-1 and exhibits a first thickness t1 along the extension direction Y, and wherein the second insulation zone 131-2 is arranged below the second electrode 130-2 and exhibits a second thickness t2 along the extension direction, the second thickness being larger than the first thickness t1. For example, the difference between t2 and t1 amounts to at least 40 nm, or to at least 50 nm, or to at least 80 nm, or at least 100 nm.

For example, the region below the first electrode 130-1 and the second electrode 130-2 on the one side and a transition between the insulation structure 131 and the semiconductor body along the extension direction Y on the other side is completely filled with an insulating material.

In an embodiment, the second insulation zone 131-2 has been produced by carrying out at least step 28. Thus, the second insulation zone 131-2 may comprise the insulating block 4.

Further, in the bottom region 13-1 of the trench 13, the insulation structure 131 may exhibit the second thickness t2, along the extension direction Y, that is at least as large as the difference between a maximum extension Y1 of the first electrode 130-1 along the extension direction Y and a maximum extension Y2 of the second electrode 130-2 along the extension direction Y.

Another part 131-3 of the insulation structure 131 may be arranged above the bottom region 13-1 of the trench 13 and may exhibit a thickness t in a lateral direction X perpendicular to the extension direction Y. For example, the first thickness t1 is equal to or larger than the thickness t in the lateral direction X. For example, the lateral direction X is substantially in parallel to a normal of a surface of the side walls 137 of the trench 13.

The bottom of the second electrode 130-2 may be separated, along the extension direction Y, from the semiconductor body 10 by the second insulation zone 131-2, which may form a relatively thick portion of the insulation structure 131. This may allow for a relatively small gate-drain capacitance, e.g., if the back side 102 is coupled to a drain terminal (not shown) and the electrode structure 130 is electrically connected to a gate terminal (not shown) of the semiconductor device 1. At the same time, the first electrode 130-1 may extend further along the extension direction Y as compared to the second electrode 130-2. Upon charging of the electrode structure 130, e.g., by means of supplying the electric signal from external of the semiconductor device to the electrode structure 130, a channel, e.g., a channel for conducting a load current, such as an inversion channel or an accumulation channel, may be formed in the semiconductor body 10 along the side walls 137 of the trench 13 in the vicinity of the first electrode 130-1. In accordance with an embodiment, at a given length of such channel, the overall depth of the trench 13 need not be increased in order to provide the relatively thick second insulation zone 131-2 underneath the second electrode 130-2. Hence, with a structure as schematically illustrated in FIG. 3, a semiconductor device 1 can be provided that may exhibit a low gate-drain charge, but does not suffer from reliability issues due to hot carrier injection, or from a high on-state resistance as a consequence of curing the reliability issues by using a lower doping of the semiconductor body 10.

Figure 4:
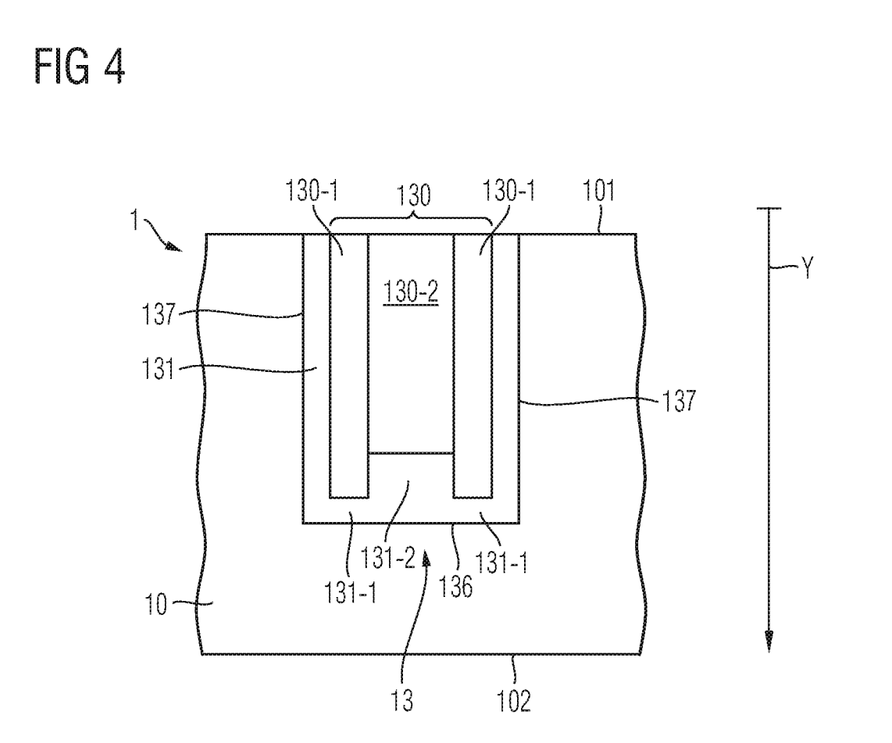
FIG. 4 schematically illustrates a section of a vertical cross-section of a semiconductor device according to one or more embodiments.

FIG. 4 schematically illustrates a section of a vertical cross-section of a further semiconductor device 1 according to one or more embodiments. For example, the semiconductor device 1 is produced by carrying out at least one of the methods described with respect to FIG. 1 and FIG. 2.

The semiconductor device 1 of FIG. 4 essentially exhibits a similar setup as compared to the setup of the semiconductor device 1 illustrated in FIG. 3. In a cross-sectional view as depicted in FIG. 4, the semiconductor device 1 may exhibit two second electrodes 130-2 within the trench 13, each of which may be in contact with the first electrode 130-1, which may form a center part of the electrode structure 130. The second electrodes 130-2 may be in electrical contact with each other. For example, both second electrodes 130-2 may be portions of an electrode extending along the side walls 137 of the trench 13. In other words, the side walls 137 of the trench 13 may be covered by lateral portions of the insulation structure 131 (cf. part 131-3 of the insulation structure 131 depicted in FIG. 3), which in turn may be covered by a layer of the second electrode material that may be included in the second electrode 130-2. Both first electrodes 130-2 may exhibit the same total extension along the extension direction Y, thereby yielding, e.g., a substantially symmetrical arrangement of the electrode structure 130 within the trench 13.

In an embodiment, the trench 13 has been produced by carrying out at least one of step 23 and step 24, as explained above.

In accordance with the embodiment illustrated in FIG. 4, the trench 13 may exhibit two substantially vertically aligned side walls 137 and the trench bottom 136 is substantially horizontally aligned, e.g., arranged substantially perpendicular to the side walls 137.

In an embodiment, the first electrode 130-1 has been produced by carrying out at least step 25 explained above. Thus, the first electrode 130-1 may comprise the spacer layer 14. Further, the second electrode 130-2 may have been produced by carrying out at least step 29 explained above. For example, the insulation structure 131 of the semiconductor device 1 of FIG. 4 has been produced by carrying out at least one of the steps 24 and 24-1 explained above. Thus, the insulation structure 131 may comprise the insulating layer 138. In addition, the second insulation zone 131-2 may have been produced by carrying out at least step 28. Thus, the second insulation zone 131-2 may comprise the insulating block 4.

For example, the electrode structure 130 may form a gate electrode of a JFET, a MOSFET or an IGBT. For example, the electrode structure 130 can be electrically connected to a gate terminal (not shown) of the semiconductor device 1. In another embodiment, the electrode structure 130 may form a compensation field plate electrode structure of a JFET or a MOSFET, wherein the electrode structure 130 may be electrically connected to a source terminal (not shown) of the semiconductor device 1.

Figure 5A:
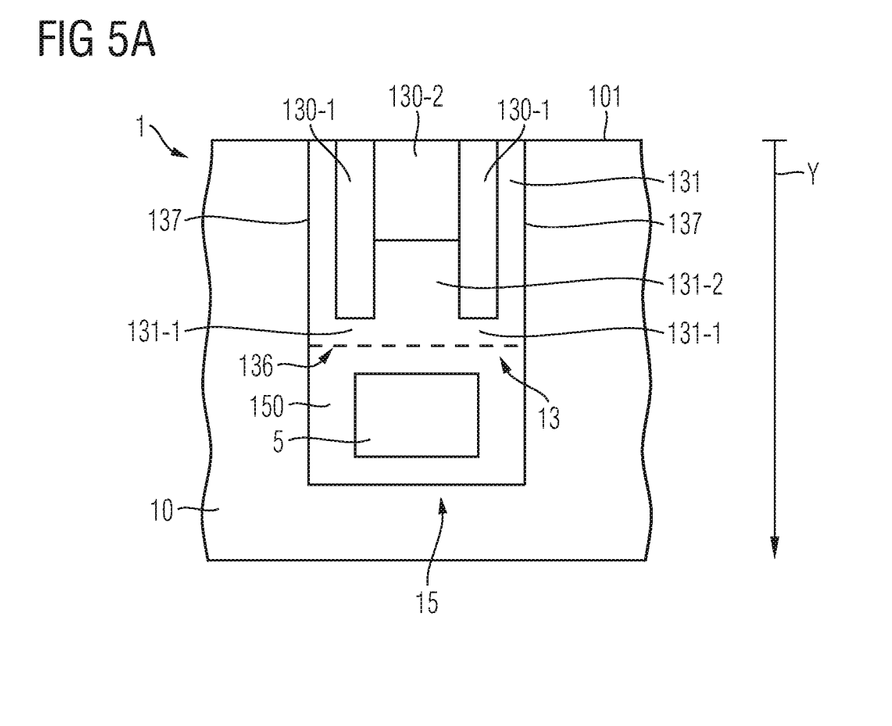
FIG. 5A schematically illustrates a section of a vertical cross-section of a semiconductor device that can be produced using a method according to one or more embodiments.

FIG. 5A schematically illustrates a section of a vertical cross-section of a yet a further semiconductor device 1 according to one or more embodiments.

The semiconductor device 1 schematically illustrated in FIG. 5A may be produced, e.g., by carrying out at least one of the methods 2 or 3 described above.

For example, the semiconductor device 1 comprises a field electrode arrangement that may be arranged underneath and in contact with the trench 13 comprising the electrode structure 130 and the insulation structure 131. The field electrode arrangement may comprise a field electrode 5 that is surrounded by a further insulation structure 150 that insulates the field electrode 5 from the semiconductor body 10. The further insulation structure 150 may be in contact with the insulation structure 131.

In accordance with an embodiment, the trench 13 that may be formed by carrying out at least one of the methods 2 and 3 as exemplarily described with respect to FIG. 1 and FIG. 2, may form an upper part of a main trench 15 that extends further in the extension direction Y than the trench 13 and that includes the field electrode arrangement comprising the field electrode 5 and the further insulation structure 150.

The field electrode 5 and the further insulation structure 150 may be arranged in a lower part of the main trench 15, e.g., underneath the bottom 136 of trench 13 (illustrated as a dashed line in FIG. 5A).

Correspondingly, at least one of the methods 2 and 3 may include an additional step of producing the lower part of the main trench 15 that may comprise the field electrode 5 and the further insulation structure 150. Subsequently, the electrode structure 130 and the insulation structure 131, including the insulating block 4, e.g., the second insulation zone 131-2, at the trench bottom 136, may be produced using the steps described with reference to FIG. 1 or FIG. 2.

The field electrode 5 can comprise, for example, metal and/or polysilicon and can be electrically connected to a source terminal (not shown) of the semiconductor device 1. The further insulation structure 150 insulating the field electrode 5 can comprise the same material as the insulation structure 131. Thus, the field electrode 5 may serve as a compensation field plate structure of, for example, a power MOSFET. The electrode structure 130 may be electrically connected to a gate terminal (not shown) of the semiconductor device 1. Due to the insulating block 4, e.g., the second insulation zone 131-2, which may also separate the second electrode 130-2 from the field electrode 150, a gate-source capacitance and an associated gate-source charge of the semiconductor device 1 may be reduced.

Figure 5B:
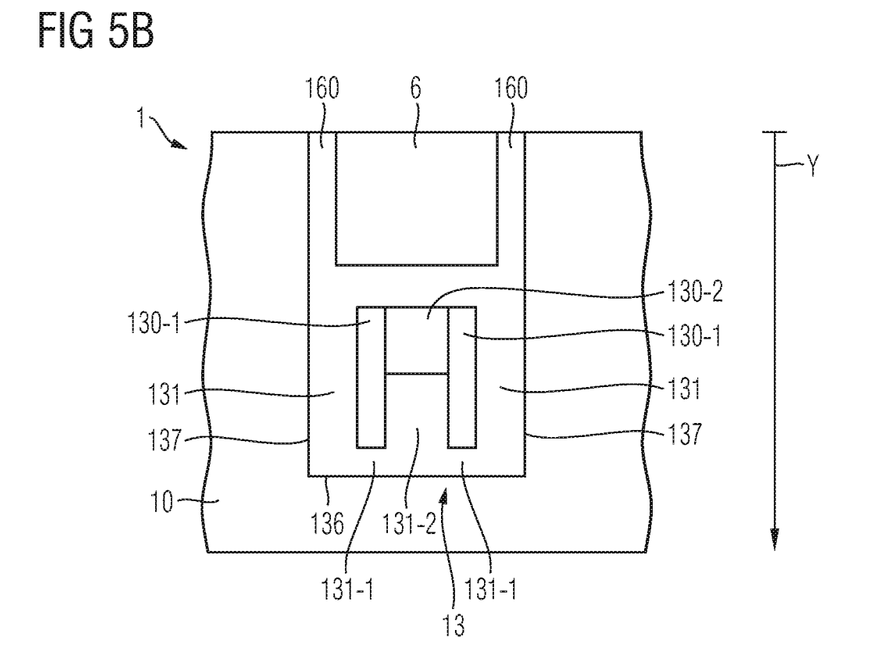
FIG. 5B schematically illustrates a section of a vertical cross-section of a semiconductor device that can be produced using a method according to one or more embodiments.

FIG. 5B schematically illustrates a section of a vertical cross-section of another semiconductor device 1 according to one or more embodiments.

The semiconductor device 1 schematically illustrated in FIG. 5B may be produced, e.g., by carrying out at least one of the methods 2 or 3 described above.

The semiconductor device 1 may comprise a gate electrode 6 that may be included in an upper part of the trench 13. The gate electrode 6 may be insulated from the semiconductor body 10 by a further insulation structure 160. The gate electrode 6 can comprise, for example, metal or polysilicon and can be electrically connected to a gate terminal (not shown) of the semiconductor device 1. The further insulation structure 160 insulating the gate electrode 6 can comprise the same material as the insulation structure 131.

Here, as opposed to the semiconductor device 1 of FIG. 5A, the electrode structure 130 may serve as a field electrode. To this end, the electrode structure 130 can be electrically connected to a source terminal (not shown) of the semiconductor device 1. Due to the insulating block 4, e.g., the second insulation zone 131-2, a source-drain capacitance and an associated source-drain charge of the semiconductor device 1 may be reduced.

The embodiments described above include the recognition that in many of the power semiconductor switches used in power electronics a bottom portion of a gate electrode, together with a bottom portion of the insulating layer and the surrounding semiconductor body, may contribute significantly to a gate-drain capacitance of the semiconductor device. The gate-drain capacitance has to be charged and discharged with a corresponding gate-drain charge upon every switching cycle. In operation, the charging and discharging of the gate-drain capacitance with the gate-drain charge increases switching times as well as power losses of the semiconductor device and of an associated gate driver. Therefore, it may be desirable to provide semiconductor devices having a low gate-drain capacitance, and thus a low gate-drain charge in operation. For example, the problem of reducing the gate-drain capacitance of such a semiconductor device can be solved by providing inside a gate the trench a thick oxide layer between the bottom portion of the gate electrode and the semiconductor body underneath the trench bottom.

However, deepening the trench in order to provide for a thicker oxide layer at the bottom may derogate the long-term reliability of the device, for example due to an increased risk of hot carrier injection into the oxide layer. This may result in a decreased repetitive avalanche capability of the power semiconductor device. Such unwanted side-effects can be compensated for by providing a lower doping level of a drift region of the semiconductor body. However, the lower doping level causes an increased on-state resistance. As a result, with the current solution, which consists in providing a thick oxide at the trench bottom, there is a trade-off between the gate-drain charge and the on-state resistance.

In accordance with one or more embodiments, a method for producing a semiconductor device is proposed, wherein an insulating block at the bottom of a trench is provided using a self-aligned process, which can be based on a spacer layers extending along the side walls of the trench. According to one or more embodiments of the proposed method, the insulating layer may be protected by portions of the spacer layer during a process for removing insulating material from inside the trench.

In accordance with one or more embodiments, a semiconductor device with a low gate-drain charge can be produced in a cost-efficient manner. Further, by varying the thickness of the insulating block and/or the thickness of the spacer layers, the gate-drain charge can be easily adjusted.

The proposed methods are not limited to manufacturing semiconductor devices with a reduced gate-charge. For example, in a trench that comprises both a gate electrode and a compensation field electrode, the insulating block provided according to the proposed methods can allow for a reduction of a gate-source charge and/or a source-drain charge, depending on the relative arrangement of the field electrode and the gate electrode.

In accordance with one or more embodiments, a semiconductor device comprising an insulating block inside a trench is proposed. The insulating block separates a second electrode from the semiconductor body in a bottom region of the trench. A first electrode in the vicinity of side walls of the trench may be configured to induce a channel in the semiconductor body upon receiving an electric signal, such as a gate signal. The first electrode may extend further along an extension direction of the trench than the second electrode. Thus, at a given channel length, a semiconductor device with a low gate-drain charge can be provided without increasing the overall depth of the trench. In this manner, reliability issues, for example due to hot carrier injection, can be avoided.

Even though formulations as "first step", "second step" and "subsequent step", "then" etc. have been used above, the order of carrying out the steps of the method 2 or 3 may be varied if suitable for the process of manufacturing the semiconductor device.

In the above, embodiments pertaining to semiconductor devices and methods of manufacturing a semiconductor device were explained. For example, the embodiments pertaining to semiconductor devices and semiconductor components may be based on silicon (Si). Accordingly, a monocrystalline semiconductor region or layer, e.g., the semiconductor body 10 of exemplary embodiments, is typically a monocrystalline Si-region or Si-layer. In other embodiments, polycrystalline or amorphous silicon may be employed.

It should, however, be understood that the semiconductor body 10 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used.

Spatially relative terms such as "under", "below", "beneath", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor body having a front side and a back side; and
   a trench included in the semiconductor body, the trench extending into the semiconductor body along an extension direction that points from the front side to the back side, wherein the trench comprises an electrode structure and an insulation structure, the insulation structure insulating the electrode structure from the semiconductor body and the electrode structure being arranged for receiving an electric signal from external of the semiconductor device,
   wherein the electrode structure includes a first electrode and a second electrode in contact with the first electrode, the first electrode comprising a first electrode material and the second electrode comprising a second electrode material different from the first electrode material, wherein the first electrode extends further along the extension direction as compared to the second electrode.

2. The semiconductor device of claim 1, wherein the first electrode material has a first electric conductivity and the second electrode material has a second electric conductivity, the second electric conductivity being higher than the first electric conductivity.

3. The semiconductor device of claim 1, wherein a part of the insulation structure is arranged in a bottom region of the trench, the part of the insulation structure having a first insulation zone and a second insulation zone, wherein the first insulation zone is arranged below the first electrode and has a first thickness along the extension direction, and wherein the second insulation zone is arranged below the second electrode and has a second thickness along the extension direction, the second thickness being larger than the first thickness.

4. The semiconductor device of claim 3, wherein another part of the insulation structure is arranged above the bottom region of the trench and has a thickness in a lateral direction perpendicular to the extension direction, the first thickness being equal to or larger than the thickness in the lateral direction.

5. The semiconductor device of claim 1, wherein the first electrode material comprises polysilicon.

6. The semiconductor device of claim 1, wherein the second electrode material comprises at least one of polysilicon and metal.

* * * * *